United States Patent
Gu et al.

(10) Patent No.: US 10,026,344 B2
(45) Date of Patent: Jul. 17, 2018

(54) PIXEL, ORGANIC LIGHT EMITTING DISPLAY DEVICE INCLUDING THE PIXEL, AND METHOD OF DRIVING THE PIXEL

(71) Applicant: SAMSUNG DISPLAY CO., LTD., Yongin-si, Gyeonggi-do (KR)

(72) Inventors: Bon Seog Gu, Yongin-si (KR); Jong Soo Kim, Yongin-si (KR); Se Hyuk Park, Yongin-si (KR); Woo Mi Bae, Yongin-si (KR); Myoung Seop Song, Yongin-si (KR); Myung Ho Lee, Yongin-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/202,802

(22) Filed: Jul. 6, 2016

(65) Prior Publication Data

US 2017/0076646 A1 Mar. 16, 2017

(30) Foreign Application Priority Data

Sep. 16, 2015 (KR) .......... 10-2015-0130786

(51) Int. Cl.
*G09G 3/30* (2006.01)
*G09G 3/00* (2006.01)
*G09G 3/3225* (2016.01)
*G09G 3/3291* (2016.01)
*G09G 3/3266* (2016.01)
(Continued)

(52) U.S. Cl.
CPC .......... *G09G 3/003* (2013.01); *G09G 3/3225* (2013.01); *G09G 3/3233* (2013.01); *G09G 3/3266* (2013.01); *G09G 3/3291* (2013.01); *H01L 27/3262* (2013.01); *H01L 27/3265* (2013.01); *H01L 51/5293* (2013.01); *G09G 2300/0814* (2013.01); *G09G 2300/0852* (2013.01); *G09G 2300/0861* (2013.01);
(Continued)

(58) Field of Classification Search
CPC ............... G09G 3/3233; G09G 3/3258; G09G 2320/045
See application file for complete search history.

(56) References Cited

U.S. PATENT DOCUMENTS

2003/0107560 A1* 6/2003 Yumoto .................. G09G 3/30
345/204
2010/0283776 A1* 11/2010 Park ..................... G09G 3/3233
345/211
(Continued)

FOREIGN PATENT DOCUMENTS

KR 10-2007-0105082 A 10/2007
KR 10-2016-0008706 A 1/2016

*Primary Examiner* — Yuzhen Shen
(74) *Attorney, Agent, or Firm* — Lee & Morse, P.C.

(57) ABSTRACT

A display device includes a first pixel including a first light emitter, a second pixel including a second light emitter, and a holding capacitor connected to the first and second pixels. The holding capacitor stores first data for the first light emitter and stores second data for the second light emitter at different times. An irradiation direction of first light emitted by the first OLED is substantially equal to an irradiation direction of second light emitted by the second OLED. The first light from the first OLED is emitted in a first frame period and the second light from the second OLED is emitted in a second frame period to prevent mixing of the first and second light.

9 Claims, 6 Drawing Sheets

(51) Int. Cl.
*H01L 27/32* (2006.01)
*H01L 51/52* (2006.01)
*G09G 3/3233* (2016.01)

(52) U.S. Cl.
CPC ............... *G09G 2300/0876* (2013.01); *G09G 2310/0262* (2013.01); *G09G 2310/08* (2013.01)

(56) References Cited

U.S. PATENT DOCUMENTS

| | | | | |
|---|---|---|---|---|
| 2011/0109612 | A1* | 5/2011 | Chaji | G09G 3/3283 345/211 |
| 2012/0068983 | A1* | 3/2012 | Tsai | G09G 3/3233 345/211 |
| 2014/0176402 | A1* | 6/2014 | Lee | G09G 3/32 345/77 |
| 2016/0012779 | A1 | 1/2016 | Gu et al. | |
| 2016/0181337 | A1* | 6/2016 | Gu | G09G 3/3258 257/40 |
| 2016/0249045 | A1* | 8/2016 | Xu | H04N 13/0033 |

* cited by examiner

PIXEL, ORGANIC LIGHT EMITTING DISPLAY DEVICE INCLUDING THE PIXEL, AND METHOD OF DRIVING THE PIXEL

CROSS-REFERENCE TO RELATED APPLICATION

Korean Patent Application No. 10-2015-0130786, filed on Sep. 16, 2015, and entitled, "Pixel, Organic Light Emitting Display Device Including the Pixel, and Method of Driving the Pixel," is incorporated by reference herein in its entirety.

BACKGROUND

1. Field

One or more embodiments described herein relate to a pixel, an organic light emitting display device including a pixel, and a method for driving a pixel.

2. Description of the Related Art

A variety of displays have been developed. Examples include liquid crystal displays, field emission displays, plasma display panels, and organic light emitting displays. Various methods have been developed for driving pixels in these devices. In addition, space efficiency relating to the arrangement and use of pixels has been studied.

SUMMARY

In accordance with one or more embodiments, a pixel includes a first organic light emitting diode (OLED); a second OLED; a first driving transistor having a first electrode to receive a first power source voltage, a second electrode electrically connected to a first node, and a gate electrode electrically connected to a second node; a second driving transistor having a first electrode to receive the first power source voltage, a second electrode electrically connected to a third node, and a gate electrode electrically connected to a fourth node; a first transistor having a first electrode electrically connected to a fifth node, a second electrode electrically connected to the second node, and a gate electrode to receive a first write signal; a second transistor having a first electrode electrically connected to the fifth node, a second electrode electrically connected to the fourth node, and a gate electrode to receive a second write signal; a third transistor having a first electrode electrically connected to the first node, a second electrode electrically connected to an anode of the first OLED, and having a gate electrode to receive a first emission control signal; a fourth transistor having a first electrode electrically connected to the third node, a second electrode electrically connected to the anode of the second OLED, and a gate electrode to receive a second emission control signal; a fifth transistor having a first electrode electrically connected to a data line, a second electrode electrically connected to the fifth node, and a gate electrode electrically connected to a scan line; a first storage capacitor having a first electrode to receive the first power source voltage and a second electrode electrically connected to the second node; a second storage capacitor having a first electrode to receive the first power source and a second electrode electrically connected to the fourth node; and a holding capacitor having a first electrode electrically connected to the fifth node and a second electrode to receive a second power source, wherein an irradiation direction of first light emitted by the first OLED is substantially equal to an irradiation direction of second light emitted by the second OLED.

The pixel may include a first polarizer on the first OLED; and a second polarizer on the second OLED, wherein the first light is circularly polarized in a first direction by the first polarizer and the second light is circularly polarized in a second direction by the second polarizer.

In accordance with one or more other embodiments, an organic light emitting display device includes a driver; and a display panel to be driven by the driver and including: a plurality of pixels; scan lines to transmit scan signals to the pixels; data lines to transmit data voltages to the pixels; first write lines to transmit first write signals to the pixels; second write lines to transmit second write signals to the pixels; first emission control lines to transmit first emission control signals to the pixels; and second emission control lines to transmit second emission control signals to the pixels.

The pixels include a first pixel that includes a first organic light emitting diode (OLED); a second OLED; a first driving transistor having a first electrode to receive a first power source voltage, a second electrode electrically connected to a first node, and a gate electrode electrically connected to a second node; a second driving transistor having a first electrode to receive the first power source voltage, a second electrode electrically connected to a third node, and a gate electrode electrically connected to a fourth node; a first transistor having a first electrode electrically connected to a fifth node, a second electrode electrically connected to the second node, and a gate electrode to receive a first write signal; a second transistor having a first electrode electrically connected to the fifth node, a second electrode electrically connected to the fourth node, and a gate electrode to receive a second write signal; a third transistor having a first electrode electrically connected to the first node, a second electrode electrically connected to an anode of the first OLED, and a gate electrode to receive a first emission control signal; a fourth transistor having a first electrode electrically connected to the third node, a second electrode electrically connected to the anode of the second OLED, and a gate electrode to receive a second emission control signal; a fifth transistor having a first electrode electrically connected to one of the data lines, a second electrode electrically connected to the fifth node, and a gate electrode electrically connected to one of the scan lines; a first storage capacitor having a first electrode to receive the first power source voltage and a second electrode electrically connected to the second node; a second storage capacitor having a first electrode to receive the first power source voltage and a second electrode electrically connected to the fourth node; and a holding capacitor having a first electrode electrically connected to the fifth node and a second electrode to receive a second power source, wherein an irradiation direction of first light emitted by the first OLED is substantially equal to an irradiation direction of second light emitted by the second OLED.

The first pixel may include a first polarizer on the first OLED; and a second polarizer on the second OLED, wherein the first light is circularly polarized in a first direction by the first polarizer and the second light is circularly polarized in a second direction by the second polarizer.

The display driver may include a timing controller to receive image data and timing signals and to generate timing control signals including a first timing control signal, a second timing control signal, and a data timing control signal based on the timing signals; a first signal driver to generate the scan signals based on the first timing control signal; a data driver to generate the data voltages based on the image data and the data timing control signal from the timing controller; and a second signal driver to generate the first write signal, the second write signal, the first emission control signal, and the second emission control signal. The first signal driver may sequentially supply the scan signals to the pixels, and the second signal driver may simultaneously supply the first write signal, the second write signal, the first emission control signal, and the second emission control signal to the pixels.

In accordance with one or more other embodiments, a method for driving a pixel includes supplying a scan signal to a scan line to store first data from a data line in a holding capacitor, and not supplying a first write signal and a second write signal to gate electrodes of a first transistor and a second transistor, the first driving transistor having a first electrode to receive a first power source voltage, a second electrode electrically connected to a first node, and a gate electrode electrically connected to a second node, and the second driving transistor having a first electrode to receive the first power source voltage, a second electrode electrically connected to a third node, and a gate electrode electrically connected to a fourth node, supplying the first write signal to the gate electrode of the first transistor and transmitting the first data to the second node; supplying the scan signal to the scan line to store second data from the data line in the holding capacitor, and not supplying the first write signal and the second write signal to the gate electrodes of the first transistor and the second transistor; and supplying the second write signal to the gate electrode of the second transistor and transmitting the second data in the fourth node, wherein an irradiation direction of first light emitted by a first organic light emitting diode (OLED) connected to the first transistor is substantially equal to an irradiation direction of second light emitted by a second OLED connected to the second transistor.

The first data and the second data may correspond to a first frame period, supplying the scan signal to the scan line to store first data from the data line in the holding capacitor and not supplying of the first write signal and the second write signal to gate electrodes of the first transistor and the second transistor may include turning on third to fifth transistors and turning of the first and second transistors, supplying the first write signal to the gate electrode of the first transistor and transmitting the first data to the second node may includes turning on the first and fourth transistors and turning off the second, third, and fifth transistors, and supplying the second write signal to the gate electrode of the second transistor and the transmitting of the second data in the fourth node may include turning on the second and third transistors and turning off the first, fourth, and fifth transistors.

The pixel may include a first polarizer on the first OLED and a second polarizer on the second OLED, and supplying the scan signal to the scan line to store second data from the data line in the holding capacitor and not supplying the first write signal and the second write signal to the gate electrodes of the first transistor and the second transistor may include turning on the third to fifth transistors and turning off the first and second transistors.

Supplying the scan signal to the scan line to store second data from the data line in the holding capacitor and not supplying of the first write signal and the second write signal to the gate electrodes of the first transistor and the second transistor may include turning on the fifth transistor and turning off the first and second transistors and at least one of the third or fourth transistors.

In accordance with one or more other embodiments, an apparatus includes a first pixel including a first light emitter; a second pixel including a second light emitter; and a holding capacitor connected to the first and second pixels, wherein the holding capacitor is to store first data for the first light emitter and is to store second data for the second light emitter at different times, and wherein an irradiation direction of first light emitted by the first OLED is substantially equal to an irradiation direction of second light emitted by the second OLED, the first light from the first OLED is to be emitted in a first frame period and the second light from the second OLED is to be emitted in a second frame period to prevent mixing of the first and second light.

The first and second pixels may be coupled to a same data line, and the holding capacitor may receive the first data and the second data from the data line. The first and second pixels may be coupled to a same scan line, a scan transistor may be connected between the same scan line and the holding capacitor, and the holding capacitor may store the first data and the second data based on switching of the scan transistor by scan signals applied at different times. The apparatus may include a first polarizer on the first light emitter, and a second polarizer on the second light emitter, the first light circularly polarized in a first direction by the first polarizer and the second light circularly polarized in a second direction by the second polarizer.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
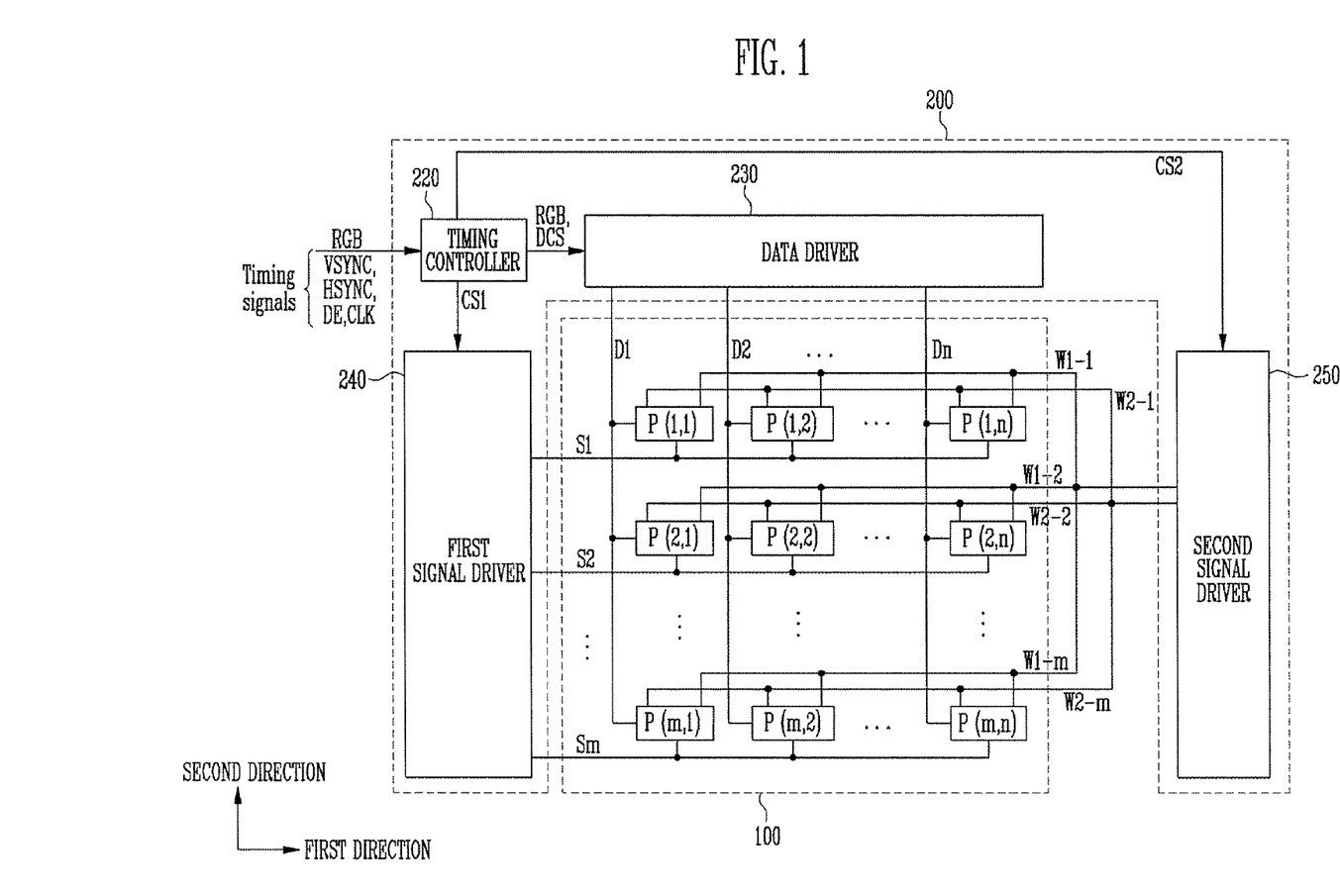
FIG. 1 illustrates an embodiment of an organic light emitting display device.

FIG. 1 illustrates an embodiment of an organic light emitting display device which includes a display panel 100 and a display panel driver 200. The display panel 100 includes pixels P(1,1) to P(m,n) (m and n are positive integers of no less than 2), data lines D1 to Dn for transmitting data voltages to the pixels P(1,1) to P(m,n), scan lines Si to Sm for transmitting scan signals to the pixels P, first write lines W1-1 to W1-$m$ for transmitting first write signal to the pixels P, and second write lines W2-1 to W2-$m$ for transmitting second write signal.

In the display panel, 100, a pixel P(i,j) is electrically connected to a scan line Si, a data line Dj, a first write line W1-$i$, and a second write line W2-$i$. The display panel 100 may also include first and second emission control lines that respectively correspond to the first write lines W1 and the second write lines W2.

The display panel driver 200 drives the display panel 100 by generating and supplying the data voltages, scan signals, first write signals, and second write signals and to the data lines D, scan lines S, first write lines W1, and second write lines W2, respectively.

The display panel driver 200 includes a timing controller 220, a data driver 230, a first signal driver 240, and a second signal driver 250, which, for example, may be separate electronic devices or may be implemented by one electronic device (for example, a display driving integrated circuit (IC)).

The timing controller 220 receives timing signals Timing Signals from an external source and generates timing control signals for controlling operation timings of the data driver 230, the first signal driver 240, and the second signal driver 250 based on the timing signals Timing Signals. The timing signals Timing Signals may include, for example, a vertical synchronizing signal VSYNC, a horizontal synchronizing signal HSYNC, a data enable signal DE, and a dot clock CLK.

The timing control signals may include a first timing control signal CS1 for controlling operation timing of the first signal driver 240, a second timing control signal CS2 for controlling operation timing of the second signal driver 250, and a data timing control signal DCS for controlling operating timing and the data voltages of the data driver 230. The data timing control signal DCS controls data sampling start timing of the data driver 230. The timing controller 220 receives image data RGB from an external source and outputs the image data RGB to the data driver 230 so that the display panel 100 may display an image.

The data driver 230 latches the image data RGB from the timing controller 220 in response to the data timing control signal DCS. The data driver 230 may include, for example, a plurality of source drive ICs. The source drive ICs may be electrically connected to the data lines D of the display panel 100, for example, by a chip-on-glass (COG) process or a tape automated bonding (TAB) process.

The first signal driver 240 sequentially supplies the scan signals to the scan lines S in response to the first timing control signal CS1. The first signal driver 240 is directly formed on a substrate of the display panel 100, for example, by a gate-in-panel (GIP) method or may be electrically connected to the scan lines S of the display panel 100 by a TAB method.

The second signal driver 250 may supply the first write signals and the second write signals to the first write lines W1 and the second write lines W2 in response to the second timing control signal CS2. The first write signals and the second write signals may be simultaneously supplied to all the pixels P or may not be supplied to the pixels P.

The second signal driver 250 may be directly formed on the substrate of the display panel 100, for example, by the GIP method or may be electrically connected to the first write lines W1 and the second write lines W2 of the display panel 100, for example, by a TAB method. The second signal driver 250 may respectively supply the first emission control signals and the second emission control signals to the first emission control lines and the second emission control lines.

Figure 2:
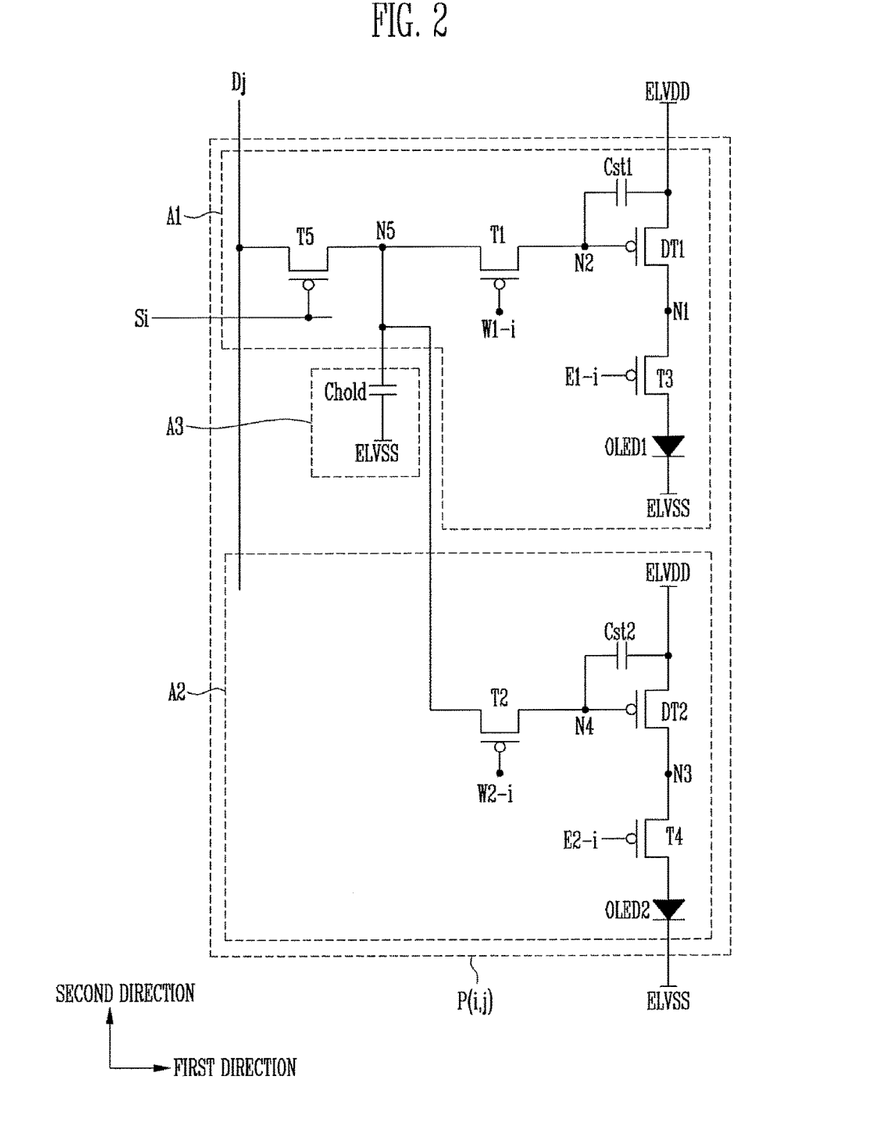
FIG. 2 illustrates an embodiment of a pixel.

FIG. 2 illustrates an embodiment of a pixel P(i,j), which, for example, may be representative of the pixels in the organic light emitting display device of FIG. 1. The pixel P(i,j) is electrically connected to a scan line Si, a data line Dj, a first write line W1-$i$, a second write line W2-$i$, a first emission control line E1-$i$, and a second emission control line E2-$i$.

The pixel P(i,j) includes a first organic light emitting diode (OLED) OLED1, a second organic light emitting diode OLED2, first and second driving transistors DT1 and DT2, first to fifth transistors T1 to T5, first and second storage capacitors Cst1 and Cst2, and a holding capacitor Chold.

A first power source ELVDD is supplied to a first electrode of the first driving transistor DT1, a second electrode of the first driving transistor DT1 is electrically connected to a first node N1, and a gate electrode of the first driving transistor DT1 is electrically connected to a second node N2.

The first power source ELVDD is supplied to a first electrode of the second driving transistor DT2, a second electrode of the second driving transistor DT2 is electrically connected to a third node N3, and a gate electrode of the second driving transistor DT2 is electrically connected to a fourth node N4.

A first electrode of the first transistor T1 is electrically connected to a fifth node N5, a second electrode of the first transistor T1 is electrically connected to the second node N2, and a gate electrode of the first transistor T1 is electrically connected to the first write line W1-$i$. A first write signal may be supplied to the gate electrode of the first transistor T1.

A first electrode of the second transistor T2 is electrically connected to the fifth node N5, a second electrode of the second transistor T2 is electrically connected to the fourth node N4, and a gate electrode of the second transistor T2 is electrically connected to the second write line W2-$i$. A second write signal may be supplied to the gate electrode of the second transistor T2.

The third transistor T3 has a first electrode electrically connected to the first node N1, a second electrode electrically connected to an anode of the first organic light emitting diode OLED1, and a gate electrode electrically connected to the first emission control line E1-$i$. A first emission control signal may be supplied to the gate electrode of the third transistor T3.

The fourth transistor T4 has a first electrode electrically connected to the third node N3, a second electrode electrically connected to an anode of the second organic light emitting diode OLED2, and a gate electrode electrically connected to the second emission control line E2-*i*. A second emission control signal may be supplied to the gate electrode of the fourth transistor T4.

The fifth transistor T5 has a first electrode electrically connected to the data line Dj, a second electrode electrically connected to the fifth node N5, and a gate electrode electrically connected to the scan line Si. The first and second driving transistors DT1 and DT2 and the first to fifth transistors T1 to T5 may be p-channel type transistors. In another embodiment, these transistors may be n-type transistors.

The first power source ELVDD is supplied to one electrode of the first storage capacitor Cst1. The other electrode of the first storage capacitor Cst1 is electrically connected to the second node N2. The first storage capacitor Cst1 maintains a voltage difference between the first power source ELVDD and the second node N2.

The first power source ELVDD is supplied to one electrode of the second storage capacitor Cst2. The other electrode of the second storage capacitor Cst2 is electrically connected to the fourth node N4. The second storage capacitor Cst2 maintains a voltage difference between the first power source ELVDD and the fourth node N4.

One electrode of the holding capacitor Chold is electrically connected to the fifth node N5. A second power source ELVSS is supplied to the other electrode of the holding capacitor Chold. Data from the data line Dj is supplied to the holding capacitor Chold and the data is supplied to the second node N2 or the fourth node N4.

The anode of the first organic light emitting diode OLED1 is electrically connected to the second electrode of the third transistor T3. The second power source ELVSS is supplied to a cathode of the first organic light emitting diode OLED1.

The anode of the second organic light emitting diode OLED2 is electrically connected to the second electrode of the fourth transistor T4. The second power source ELVSS is supplied to a cathode of the second organic light emitting diode OLED2. The voltage level of the second power source ELVSS is lower than a voltage level of the first power source ELVDD. When the third transistor T3 and the fourth transistor T4 are turned on, current may flow through the first organic light emitting diode OLED1 and the second organic light emitting diode OLED2 to allow the first organic light emitting diode OLED1 and the second organic light emitting diode OLED2 to emit light.

In FIG. 2, the pixel P(i,j) may include a first region A1, a second region A2, and a third region A3. The first region A1 includes the first organic light emitting diode OLED1. The second region A2 includes the second organic light emitting diode OLED2. The third region A3 includes the holding capacitor Chold. The first region A1 may further include the first driving transistor DT1, the first transistor T1, the third transistor T3, the fifth transistor T5, and the first storage capacitor Cst1 for driving the first organic light emitting diode OLED1. The second region A2 may further include the second driving transistor DT2, the second transistor T2, the fourth transistor T4, and the second storage capacitor Cst2 for driving the second organic light emitting diode OLED2.

In the embodiment of FIG. 2, the fifth transistor T5 is in the first region A1. In another embodiment, since the fifth transistor T5 also drives the second organic light emitting diode OLED2, the fifth transistor T5 may be in the second region A2 or the third region A3.

Figure 3:
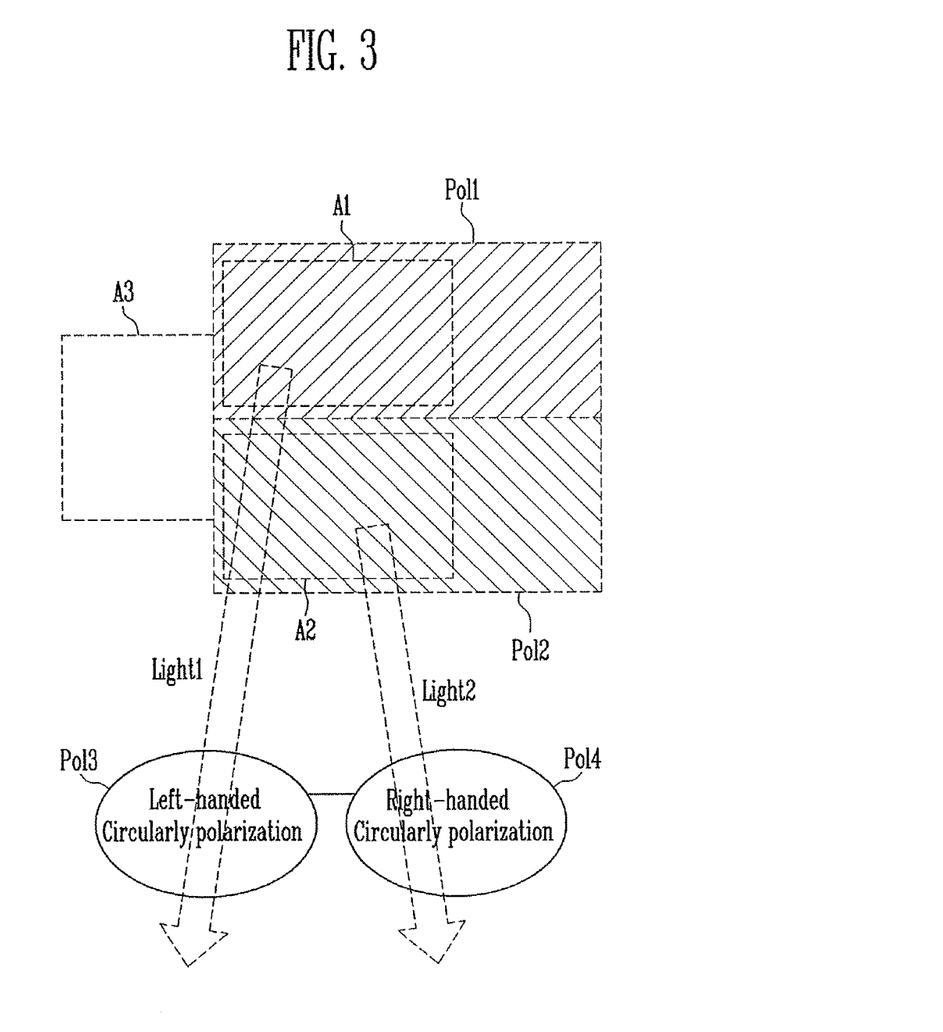
FIG. 3 illustrates an example of light generated by the pixels.

FIG. 3 illustrates an example of first light and second light generated by pixels of the organic light emitting display device of FIG. 1. Referring to FIG. 3, a first polarization unit Pol1 is in the first region A1 and a second polarization unit Pol2 is in the second region A2. The first polarization unit Pol1 and the second polarization unit Pol2 are not in the third region A3.

The light generated by the first organic light emitting diode OLED1 is circularly polarized in a first direction (e.g., left-handed circularly polarized) by the first polarization unit Pol1 and the circularly polarized first light Light1 is emitted. The light generated by the second organic light emitting diode OLED2 is circularly polarized in a second direction (e.g., right-handed circularly polarized) by the second polarization unit Pol2 and this circularly polarized second light Light2 is emitted.

Glasses for the display device may include a left-handed circularly polarized third polarization unit Pol3 corresponding to the left eye and a right-handed circularly polarized fourth polarization unit Pol4 corresponding to the right eye. When a user wears the glasses, the first light Light1 may not reach the right eye by the fourth polarization unit Pol4 and the second light Light2 may not reach the left eye by the third polarization unit Pol3. Therefore, the first light Light1 reaches only the left eye and the second light Light2 reaches only the right eye. Thus, a three-dimensional display may be formed by adding the first polarization unit Pol1 and the second polarization unit Pol2.

The pixel P(i,j) stores the data from the data line Dj in the holding capacitor Chold and transmits the stored data to the gate electrode of the first driving transistor DT1 or the second driving transistor DT2. The first organic light emitting diode OLED1 and the second organic light emitting diode OLED2 emit light components based on current controlled by the first driving transistor DT1 and the second driving transistor DT2. In the pixel P(i,j), since the two driving transistors DT1 and DT2 share the holding capacitor Chold, the area of the pixel circuit may be reduced and thus a display with a high resolution may be implemented in a smaller space.

Figure 4:
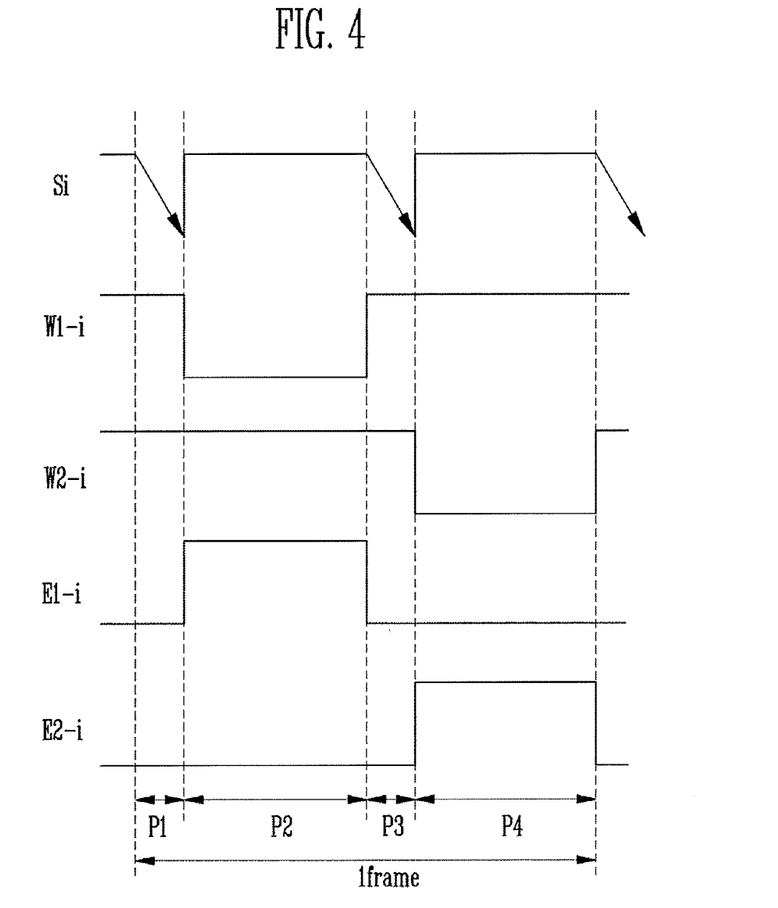
FIG. 4 illustrates an embodiment of a method for driving pixels.
Figure 5:
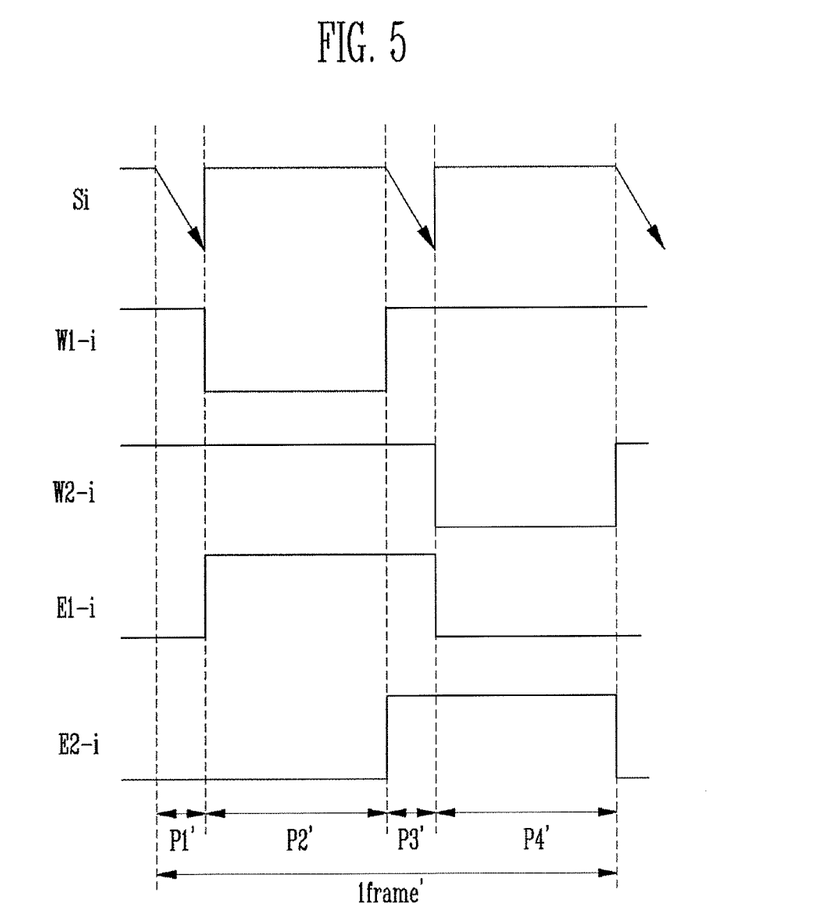
FIG. 5 illustrates another embodiment of a method for driving pixels.
Figure 6:
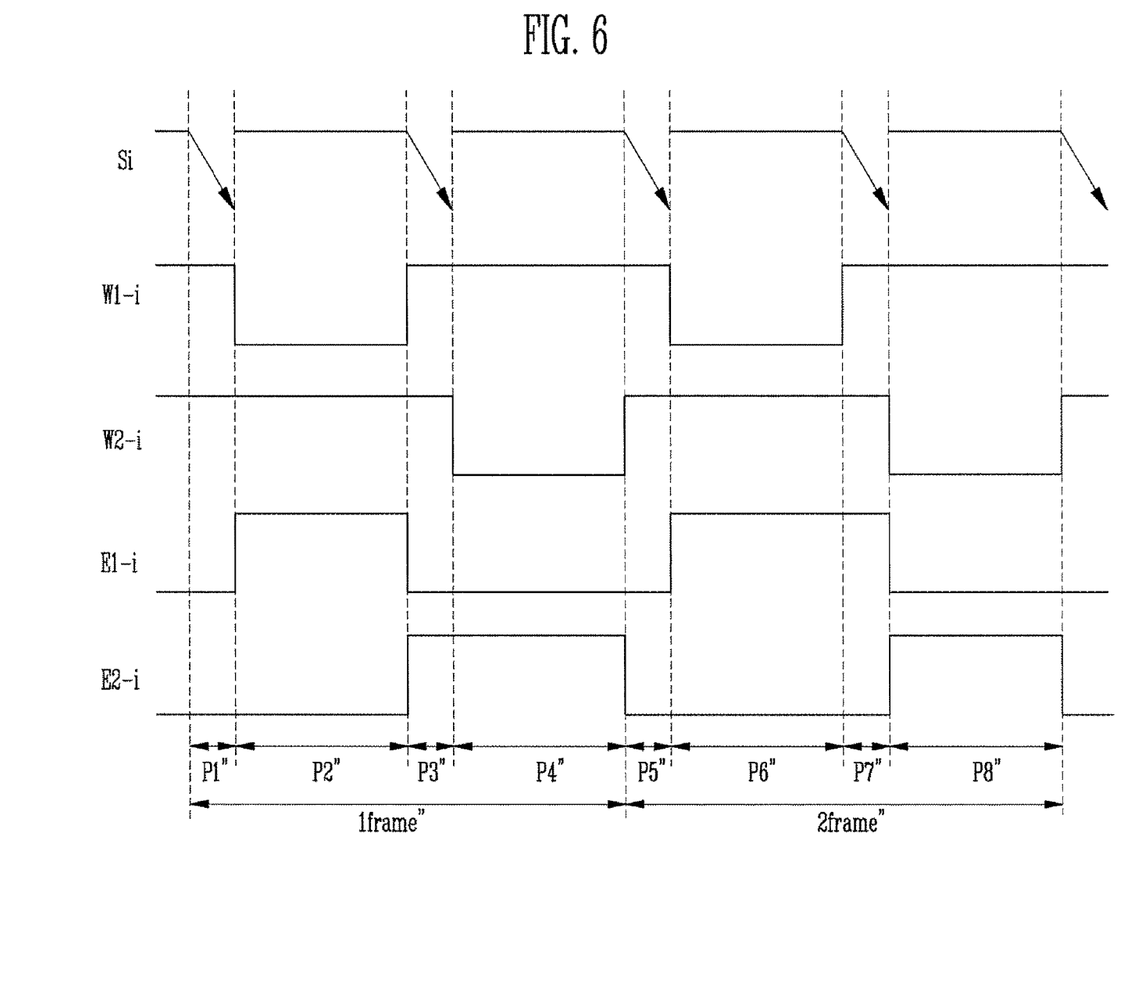
FIG. 6 illustrates another embodiment of a method for driving pixels.

FIGS. 4, 5, and 6 illustrate embodiments of a method for driving a pixel, which, for example, may be the pixel in the organic light emitting display device of FIG. 2. In FIGS. 4 to 6, it may be assumed that the signals (the scan signals, the first write signal, the second write signal, the first emission control signal, and the second emission control signal) are supplied when a voltage having a low level is supplied to the lines (the scan lines S, the first write line W1-*i*, the second write line W2-*i*, the first emission control line E1-*i*, and the second emission control line E2-*i*). In addition, it may be assumed that the driving transistors DT1 and DT2 and the transistors T1 to T5 are turned on when a level of a voltage supplied to the gate electrodes of the driving transistors DT1 and DT2 and the transistors T1 to T5 is low.

Referring to FIG. 4, it is assumed that the first polarization unit Pol1 is on the first organic light emitting diode OLED1 and the second polarization unit Pol1 is on the second organic light emitting diode OLED2. Also, a first frame period 1*frame* includes first to fourth periods P1 to P4.

In the first period P1, the scan signals are sequentially supplied to the scan lines S. In at least a partial period of the first period P1, the scan signal is supplied to the scan line Si to turn on the fifth transistor T5 and first data from the data line Dj is supplied to the holding capacitor Chold.

Also, in the first period P1, the first write signal and the second write signal are not respectively supplied to the first write line W1-*i* and the second write line W2-*i*. Also, the first emission control signal and the second emission control signal are supplied to the first emission control line E1-*i* and the second emission control line E2-*i*, respectively. The first transistor T1 and the second transistor T2 are turned off and the third transistor T3 and the fourth transistor T4 are turned on. The holding capacitor Chold stores the first data from the data line Dj. The first data may be in the form of a voltage or a current. In the first period P1, the first organic light emitting diode OLED1 and the second organic light emitting diode OLED2 may emit the light components. The first period P1 corresponds to first storage operation in which the first data is stored.

In the second period P2, the first write signal is supplied to the first write line W1-$i$ and the second write signal is not supplied to the second write line W2-$i$. In addition, the first emission control signal is not supplied to the first emission control line E1-$i$ and the second emission control signal is supplied to the second emission control line E2-$i$. Therefore, the second transistor T2, the third transistor T3, and the fifth transistor T5 are turned off and the first transistor T1 and the fourth transistor T4 are turned on.

Also, in the second period P2, the first organic light emitting diode OLED1 does not emit light and the second organic light emitting diode OLED2 may emit light. The second period P2 corresponds to first transmitting operation in which the first data stored in the holding capacitor Chold is transmitted to the second node N2.

In the third period P3, the scan signals are sequentially supplied to the scan lines S. In at least a partial period of the third period P3, the scan signal is supplied to the scan line Si so that the fifth transistor T5 is turned on and second data from the data line Dj is supplied to the holding capacitor Chold.

Also, in the third period P3, the first write signal and the second write signal are not respectively supplied to the first write line W1-$i$ and the second write line W2-$i$ and the first emission control signal and the second emission control signal are supplied to the first emission control line E1-$i$ and the second emission control line E2-$i$, respectively. Therefore, the first transistor T1 and the second transistor T2 are turned off and the third transistor T3 and the fourth transistor T4 are turned on.

The holding capacitor Chold stores the second data from the data line Dj. The second data may be in the form of a voltage or a current like the first data. The third period P3 corresponds to second storage operation in which the second data is stored. In the third period P3, although data supplied in the first frame period 1*frame* is transmitted to the first driving transistor DT1 and data supplied before the first frame period 1*frame* is transmitted to the second driving transistor DT2, only the first light Light1 reaches the left eye and only the second light Light2 may reach the right eye when the user wears the glasses. Therefore, although both the first organic light emitting diode OLED1 and the second organic light emitting diode OLED2 emit light components, images to which different frame periods correspond are not mixed together.

In the fourth period P4, the first write signal is not supplied to the first write line W1-$i$ and the second write signal is supplied to the second write line W2-$i$. In addition, the first emission control signal is supplied to the first emission control line E1-$i$ and the second emission control signal is not supplied to the second emission control line E2-$i$. Therefore, the first transistor T1, the fourth transistor T4, and the fifth transistor T5 are turned off and the second transistor T2 and the third transistor T3 are turned on.

Also, in the fourth period P4, the second organic light emitting diode OLED2 does not emit light and the first organic light emitting diode OLED1 may emit light. The fourth period P4 corresponds to second transmitting operation in which the second data stored in the holding capacitor Chold is transmitted to the fourth node N4.

FIG. 5 illustrates another embodiment of a method for driving the pixel of FIG. 2. This method will be described with reference to FIGS. 1 to 5. In FIG. 5, it is assumed that the first polarization unit Pol1 is not on the first organic light emitting diode OLED1 and the second polarization unit Pol2 is not on the second organic light emitting diode OLED2. A first frame period 1frame' includes first to fourth periods P1' to P4'. The first period P1' may be the same as the first period P1.

In the first period P1', the first organic light emitting diode OLED1 emits light based on a data voltage received in a frame period immediately before a frame period 1frame'. The second organic light emitting diode OLED2 also emits light based on the data voltage received in the frame period immediately before the frame period 1frame'. Since the data voltage in the same frame period is supplied to the first driving transistor DT1 and the second driving transistor DT2, the first organic light emitting diode OLED1 and the second organic light emitting diode OLED2 may simultaneously emit light components. The second period P2' may be same as the second period P2. The first data from the holding capacitor Chold is supplied to the first driving transistor DT1, and the first organic light emitting diode OLED1 does not emit light and the second organic light emitting diode OLED2 may emit light.

In the third period P3', the scan signals are sequentially supplied to the scan lines S. However, unlike in the third period P3 of FIG. 4, since the first polarization unit Pol1 and the second polarization unit Pol2 do not exist, the first light Light1 and the second light Light2 may be mixed together. The data supplied in the first frame period 1frame' is transmitted to the first driving transistor DT1 and the data supplied in the frame period immediately before the first frame period 1frame' is transmitted to the second driving transistor DT2.

When both the first organic light emitting diode OLED1 and the second organic light emitting diode OLED2 simultaneously emit light components, images of different frames are simultaneously displayed. In at least a partial period of the third period P3', the scan signal is supplied to the scan line Si to turn on the fifth transistor T5, and the second data from the data line Dj is supplied to the holding capacitor Chold.

Also, in the third period P3', the first write signal and the second write signal are not respectively supplied to the first write line W1-$i$ and the second write line W2-$i$. In addition, the first emission control signal and the second emission control signal are not supplied to the first emission control line E1-$i$ and the second emission control line E2-$i$. Therefore, the first to fourth transistors T1 to T4 are turned off. The holding capacitor Chold stores the second data from the data line Dj. The second data may be in the form of a voltage or a current like the first data.

Also, in the third period P3', the first organic light emitting diode OLED1 and the second organic light emitting diode OLED2 do not emit light components. Since the first organic light emitting diode OLED1 and the second organic light emitting diode OLED2 do not emit the light components, images corresponding to different frame periods are not simultaneously displayed.

The fourth period P4' may be the same as the fourth period P4. Also, the second data from the holding capacitor Chold may be supplied to the second driving transistor DT2, and the second organic light emitting diode OLED2 does not emit light and the first organic light emitting diode OLED1 may emit light.

FIG. 6 illustrates another embodiment of a method for driving the pixel in FIG. 2. The method will be described with reference to FIGS. 1 to 6. In FIG. 6, it is assumed that the first polarization unit Pol1 is not on the first organic light emitting diode OLED1 and the second polarization unit Pol2 is not on the second organic light emitting diode OLED2. Also, a first frame period 1frame" includes first to fourth periods P1" to P4" and a second frame period 2frame" includes fifth to eighth periods P5" to P8". Also, the first period P1", the second period P2", and the fourth period P4" of the first frame period 1frame" may be respectively the same as the first period P1, the second period P2, and the fourth period P4 in FIG. 4.

In the third period P3", the scan signals are sequentially supplied to the scan lines S. However, unlike in the third period P3 of FIG. 4, since the first polarization unit Pol1 and the second polarization unit Pol2 do not exist, the first light Light1 and the second light Light2 may be mixed together.

The data supplied in the first frame period 1frame" is transmitted to the first driving transistor DT1 and the data supplied in the frame period immediately before the first frame period 1frame" is transmitted to the second driving transistor DT2. When both the first organic light emitting diode OLED1 and the second organic light emitting diode OLED2 simultaneously emit light components, images corresponding to different frame periods are simultaneously displayed.

In at least a partial period of the third period P3", the scan signal is supplied to the scan line Si to turn on the fifth transistor T5 and the second data from the data line Dj is supplied to the holding capacitor Chold. Also, in the third period P3", the first write signal and the second write signal are not respectively supplied to the first write line W1-i and the second write line W2-I, and the first emission control signal is supplied to the first emission control line E1-i and the second emission control signal is not supplied to the second emission control line E2-i. Therefore, the first transistor T1, the second transistor T2, and the fourth transistor T4 are turned off and the third transistor T3 is turned on. The holding capacitor Chold stores the second data from the data line Dj. The second data may be in the form of a voltage or a current like the first data.

Also, in the third period P3", the first organic light emitting diode OLED1 emits light and the second organic light emitting diode OLED2 does not emit light. Since only the first organic light emitting diode OLED1 emits light, images corresponding to different frame periods are not simultaneously displayed.

The fifth period P5", the sixth period P6", and the eighth period P8" of the second frame period 2frame" may be respectively the same as the first period P1, the second period P2, and the fourth period P4 of FIG. 4.

In the seventh period P7", the scan signals are sequentially supplied to the scan lines S. In at least a partial period of the seventh period P7", the scan signal is supplied to the scan line Si to turn on the fifth transistor T5 and the second data from the data line Dj is supplied to the holding capacitor Chold. Also, in the seventh period P7", the first write signal and the second write signal are not respectively supplied to the first write line W1-i and the second write line W2-I, and the first emission control signal is not supplied to the first emission control line E1-i and the second emission control signal is supplied to the second emission control line E2-i. Therefore, the first transistor T1, the second transistor T2, and the third transistor T3 are turned off and the fourth transistor T4 is turned on. The holding capacitor Chold stores the second data from the data line Dj. The second data may be in the form of a voltage or a current like the first data.

Also, in the seventh period P7", the first organic light emitting diode OLED1 does not emit light and the second organic light emitting diode OLED2 emits light. Since only the second organic light emitting diode OLED2 emits light, images corresponding to different frame periods are not simultaneously displayed.

The pixel P(i,j) in FIG. 2 has been described as including two OLEDs. Thus, the pixel P(i,j) may be considered to have two sub-pixels connected to a same holding capacitor, where the two sub-pixels emit different light or light of different colors based on respective data signals. Alternatively, FIG. 2 may be considered to correspond to two pixels connected to the same holding capacitor, where the pixels emit different light or light of different colors.

Recently, research on improving resolution of the organic light emitting display device is being performed. Various methods of driving a pixel in a limited space have been suggested. Recently, research on a method of two or more driving transistors sharing different elements is being performed.

There are provided a pixel in which an area of a pixel circuit is reduced, an organic light emitting display device including the pixel, and a method of driving the pixel.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the embodiments in the claims.

What is claimed is:
1. A pixel, comprising:
a first organic light emitting diode (OLED);
a second OLED;
a first driving transistor having a first electrode to receive a first power source voltage, a second electrode electrically connected to a first node, and a gate electrode electrically connected to a second node;
a second driving transistor having a first electrode to receive the first power source voltage, a second electrode electrically connected to a third node, and a gate electrode electrically connected to a fourth node;
a first transistor having a first electrode electrically connected to a fifth node, a second electrode electrically connected to the second node, and a gate electrode to receive a first write signal;
a second transistor having a first electrode electrically connected to the fifth node, a second electrode electrically connected to the fourth node, and a gate electrode to receive a second write signal;
a third transistor having a first electrode electrically connected to the first node, a second electrode electrically connected to an anode of the first OLED, and having a gate electrode to receive a first emission control signal;

a fourth transistor having a first electrode electrically connected to the third node, a second electrode electrically connected to the anode of the second OLED, and a gate electrode to receive a second emission control signal;

a fifth transistor having a first electrode electrically connected to a data line, a second electrode electrically connected to the fifth node, and a gate electrode electrically connected to a scan line;

a first storage capacitor having a first electrode to receive the first power source voltage and a second electrode electrically connected to the second node;

a second storage capacitor having a first electrode to receive the first power source and a second electrode electrically connected to the fourth node; and a holding capacitor having a first electrode electrically connected to the fifth node and a second electrode to receive a second power source, wherein an irradiation direction of first light emitted by the first OLED is substantially equal to an irradiation direction of second light emitted by the second OLED.

2. The pixel as claimed in claim 1, further comprising:
a first polarizer on the first OLED; and
a second polarizer on the second OLED,
wherein the first light is circularly polarized in a first direction by the first polarizer and the second light is circularly polarized in a second direction by the second polarizer.

3. An organic light emitting display device, comprising:
a driver; and
a display panel to be driven by the driver and including:
a plurality of pixels;
scan lines to transmit scan signals to the pixels;
data lines to transmit data voltages to the pixels;
first write lines to transmit first write signals to the pixels;
second write lines to transmit second write signals to the pixels;
first emission control lines to transmit first emission control signals to the pixels; and
second emission control lines to transmit second emission control signals to the pixels, wherein the pixels include a first pixel that includes:
a first organic light emitting diode (OLED);
a second OLED;
a first driving transistor having a first electrode to receive a first power source voltage, a second electrode electrically connected to a first node, and a gate electrode electrically connected to a second node;
a second driving transistor having a first electrode to receive the first power source voltage, a second electrode electrically connected to a third node, and a gate electrode electrically connected to a fourth node;
a first transistor having a first electrode electrically connected to a fifth node, a second electrode electrically connected to the second node, and a gate electrode to receive a first write signal;
a second transistor having a first electrode electrically connected to the fifth node, a second electrode electrically connected to the fourth node, and a gate electrode to receive a second write signal;
a third transistor having a first electrode electrically connected to the first node, a second electrode electrically connected to an anode of the first OLED, and a gate electrode to receive a first emission control signal;
a fourth transistor having a first electrode electrically connected to the third node, a second electrode electrically connected to the anode of the second OLED, and a gate electrode to receive a second emission control signal;

a fifth transistor having a first electrode electrically connected to one of the data lines, a second electrode electrically connected to the fifth node, and a gate electrode electrically connected to one of the scan lines;

a first storage capacitor having a first electrode to receive the first power source voltage and a second electrode electrically connected to the second node;

a second storage capacitor having a first electrode to receive the first power source voltage and a second electrode electrically connected to the fourth node; and a holding capacitor having a first electrode electrically connected to the fifth node and a second electrode to receive a second power source, wherein an irradiation direction of first light emitted by the first OLED is substantially equal to an irradiation direction of second light emitted by the second OLED.

4. The display device as claimed in claim 3, wherein the first pixel includes:
a first polarizer on the first OLED; and
a second polarizer on the second OLED,
wherein the first light is circularly polarized in a first direction by the first polarizer and the second light is circularly polarized in a second direction by the second polarizer.

5. The display device as claimed in claim 3, wherein the display driver includes:
a timing controller to receive image data and timing signals and to generate timing control signals including a first timing control signal, a second timing control signal, and a data timing control signal based on the timing signals;
a first signal driver to generate the scan signals based on the first timing control signal;
a data driver to generate the data voltages based on the image data and the data timing control signal from the timing controller; and
a second signal driver to generate the first write signal, the second write signal, the first emission control signal, and the second emission control signal.

6. The display device as claimed in claim 5, wherein:
the first signal driver is to sequentially supply the scan signals to the pixels, and
the second signal driver is to simultaneously supply the first write signal, the second write signal, the first emission control signal, and the second emission control signal to the pixels.

7. An apparatus, comprising:
a first pixel including a first driving transistor coupled to a first light emitter;
a second pixel including a second driving transistor coupled to a second light emitter; and
a holding capacitor connected to the first driving transistor of the first pixel and the second driving transistor of the second pixel, wherein the holding capacitor is to store first data for the first light emitter and is to store second data for the second light emitter at different times, and wherein an irradiation direction of first light emitted by the first light emitter is substantially equal to an irradiation direction of second light emitted by the second light emitter, wherein:
the first and second pixels are coupled to a same scan line,
a scan transistor is connected between the same scan line and the holding capacitor, and the holding capacitor is to store the first data and the second data based on switching of the scan transistor by scan signals applied at different times.

8. The apparatus as claimed in claim 7, wherein:

the first and second pixels are coupled to a same data line, and the holding capacitor is to receive the first data and the second data from the data line.

9. The apparatus as claimed in claim 7, further comprising:

a first polarizer on the first light emitter, and a second polarizer on the second light emitter, wherein the first light is circularly polarized in a first direction by the first polarizer and the second light is circularly polarized in a second direction by the second polarizer.

\* \* \* \* \*